United States Patent [19]
Hirota

[11] Patent Number: 5,239,192
[45] Date of Patent: Aug. 24, 1993

[54] HORIZONTAL CHARGE TRANSFER REGISTER

[75] Inventor: Isao Hirota, Kanagawa, Japan

[73] Assignee: Sony Corporation, Tokyo, Japan

[21] Appl. No.: 842,645

[22] Filed: Feb. 27, 1992

[30] Foreign Application Priority Data

Feb. 28, 1991 [JP] Japan ................................ 3-034297

[51] Int. Cl.$^5$ .................. H01L 29/78; H01L 27/02
[52] U.S. Cl. .................................. 257/239; 257/240; 257/243; 257/246
[58] Field of Search ............... 357/24, 24 M; 257/239, 257/240, 243, 245, 246; 377/61, 62, 63

[56] References Cited
FOREIGN PATENT DOCUMENTS

60-10675  1/1985  Japan ................................ 357/24
60-187054 9/1985  Japan ................................ 357/24

Primary Examiner—Andrew J. James
Assistant Examiner—Ngan Van Ngo
Attorney, Agent, or Firm—Hill, Steadman & Simpson

[57] ABSTRACT

A horizontal charge transfer register has an array of charge transfer sections for transferring signal charges in a charge transfer direction, the charge transfer sections including a final charge transfer section. A floating diffusion region is connected to the final charge transfer section through a horizontal output gate section. A pair of potential barrier regions or a potential well region extends from the final charge transfer section to the horizontal output gate section, for orienting an electric field in the charge transfer direction in the horizontal output gate section. The potential barrier regions are spaced from each other by a distance which is progressively smaller from the final charge transfer section toward the horizontal output gate section. The potential barrier regions define a charge transfer path therebetween which is substantially the same as or close to the width of the floating diffusion region. The potential well region extends from the final charge transfer section centrally through the horizontal output gate section to the floating diffusion region.

6 Claims, 8 Drawing Sheets

HORIZONTAL CHARGE TRANSFER REGISTER

BACKGROUND OF THE INVENTION

1. Field of the Invention:

The present invention relates to a horizontal charge transfer register for use in a CCD (Charge-Coupled-Device) solid-state imaging device or the like.

Figure 1:
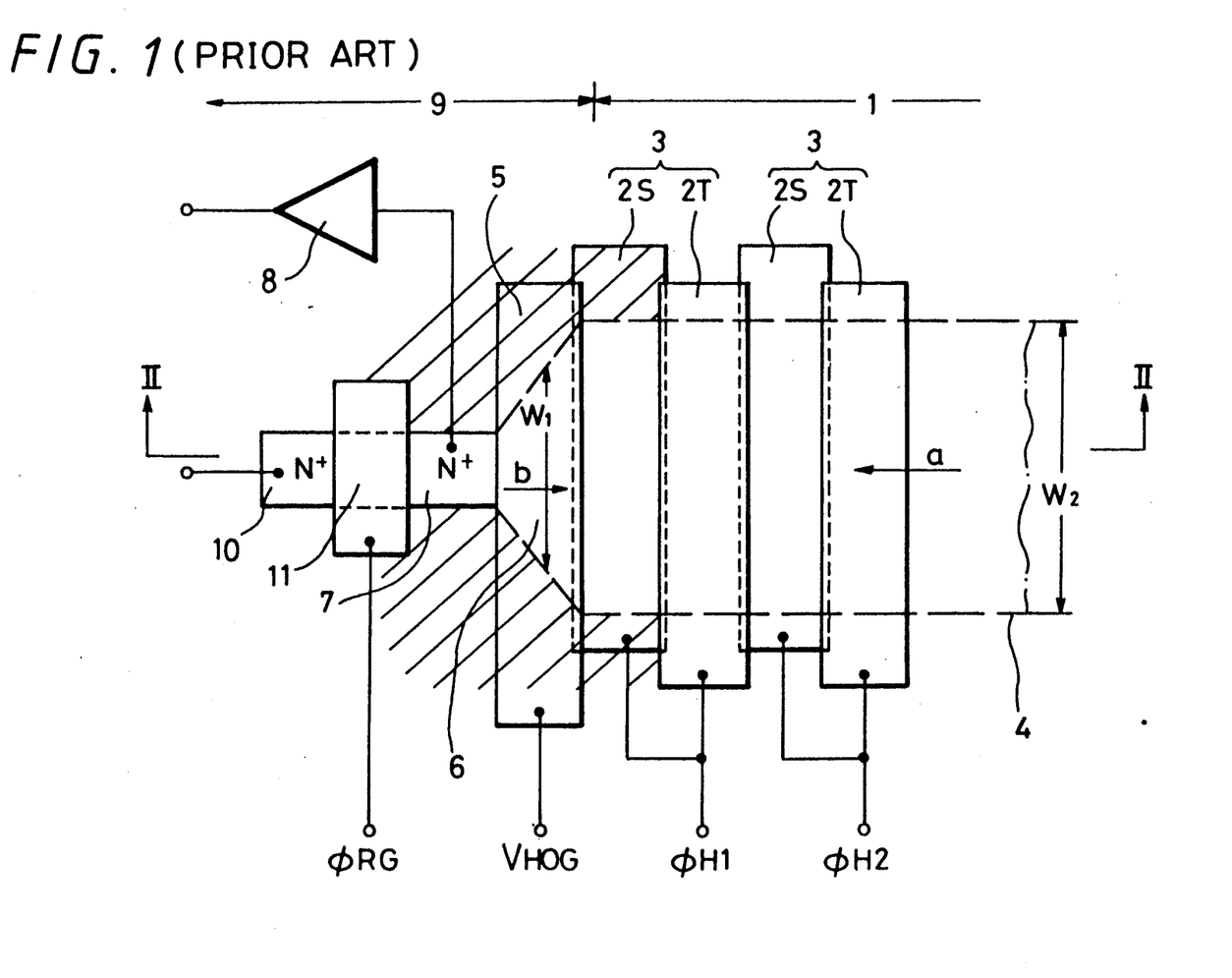
FIG. 1 is a fragmentary plan view of a structure of a conventional horizontal charge transfer register.
Figure 2:
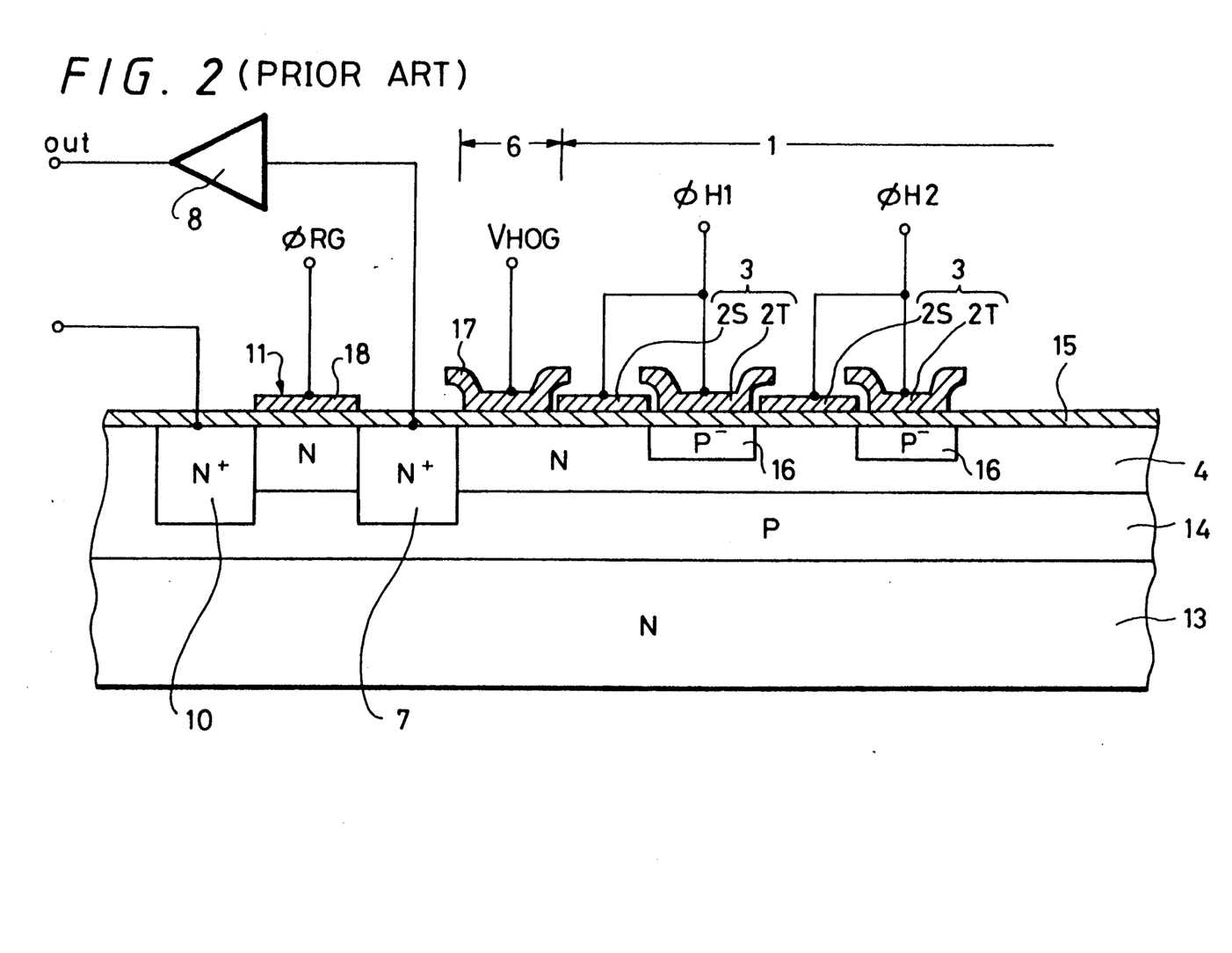
FIG. 2 is a cross-sectional view taken along line II—II of FIG. 1.

2. Description of the Prior Art:

FIGS. 1 and 2 of the accompanying drawings show final and output stages of a conventional horizontal charge transfer register in a CCD solid-state imaging device. As shown in FIG. 1, the horizontal charge transfer register, generally denoted at 1, has an array of charge transfer sections 3 each having charge transfer electrodes, i.e., a charge storage electrode 2S and a charge transfer electrode 2T. The charge transfer sections 3 horizontally transfer signal charges in response to two-phase drive pulses $\phi H_1$, $\phi H_2$. The final charge transfer section 3 is supplied with an independent drive pulse $\phi H_1$ that is larger in amplitude than those drive pulses $\phi H_1$, $\phi H_2$ which are applied to the charge transfer sections 3 that precede the final charge transfer section 3. The horizontal charge transfer register 1 also includes an embedded channel region 4 serving as a charge transfer path, and a channel stop region 5 in an output section 9. The final charge transfer section 3 of the horizontal charge transfer register I is connected to a floating diffusion region 7 in the output section 9 through a horizontal output gate section 6 to which a gate voltage $V_{HOG}$ is applied. Signal charges from the horizontal charge transfer register 1 are transferred through the horizontal output gate section 6 to the floating diffusion region 7 by which the signal charges are converted into a voltage that is outputted through an output amplifier 8. The output section 9 also includes a reset gate section 11 for discharging signal charges, which have been transferred to the floating diffusion region 7, into a reset drain region 10 in response to a gate voltage $\phi RG$ applied to the reset gate section 11 between the floating diffusion region 7 and the reset drain region 10.

As shown in FIG. 2, which is a cross-sectional view taken along line II—II of FIG. 1, a P-type well region 14 is formed on an N-type semiconductor substrate 13, and the embedded channel region 4, which is of the N type, as the charge transfer path of the horizontal charge transfer register 1 is formed in the P-type well region 14. The charge storage and transfer electrodes 2S, 2T are alternately deposited on the N-type embedded channel region 4 with an insulative film 15 interposed therebetween. The charge storage and transfer electrodes 2S, 2T are connected in pairs, providing the array of charge transfer sections 3 to which two-phase drive pulses $\phi H_1$, $\phi H_2$ will be applied. P− layers 16 for developing a potential difference are disposed in the N-type embedded channel region 4 beneath the charge transfer electrodes 2T, respectively.

The horizontal output gate section 6 comprises a horizontal output gate electrode 17 deposited on the insulative film 15 on the embedded channel region 4. The gate voltage $V_{HOG}$ is applied to the horizontal output gate electrode 17. Both the floating diffusion region 7 and the reset drain region 10 are in the form of an N+ layer. The reset gate section 11 comprises a reset gate electrode 18 deposited on the insulative film 15 on the N-type region between the regions 7, 10.

In order to increase the gain of a so-called floating diffusion amplifier including the floating diffusion region 7 and the output amplifier 8, the charge transfer path or the embedded channel region 4 beneath the horizontal output gate section 6 is tapered or constricted such that the width $W_1$ thereof is progressively smaller from the final charge transfer section 3 toward the floating diffusion region 7.

Figure 8:
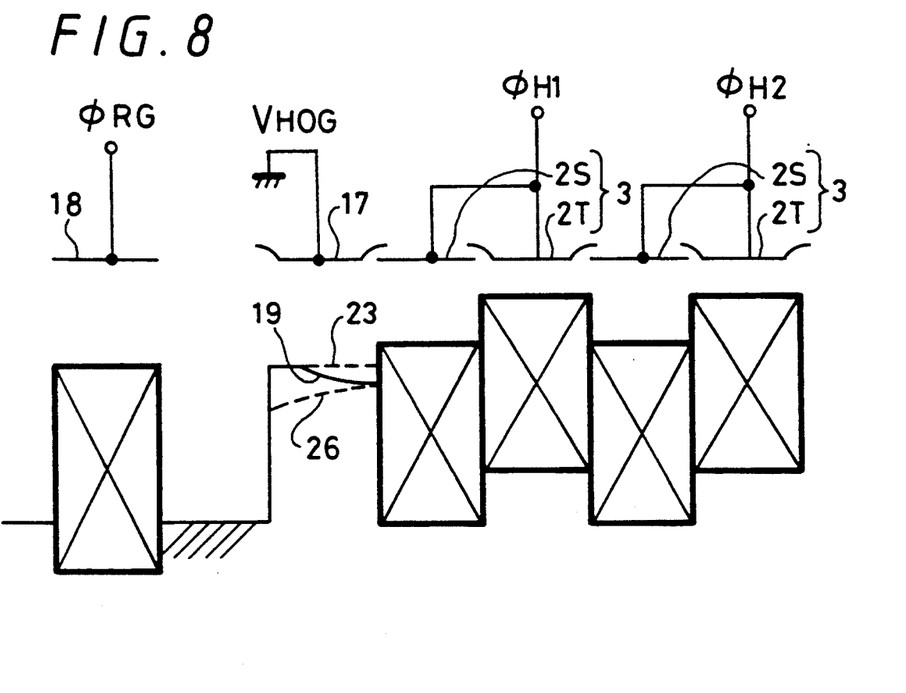
FIG. 8 is a diagram of potentials developed in the horizontal charge transfer register according to the present invention.

As described above, in the conventional horizontal charge transfer register 1, the width $W_1$ of the embedded channel region 4 beneath the horizontal output gate section 6 is progressively smaller from the final charge transfer section 3 toward the floating diffusion region 7. Therefore, the electric field of the horizontal output gate section 6 acts in a direction b that is opposite to a direction a in which signal charges are transferred, under the influence of the electric field of the surrounding P+ channel stop region 5. This is because the electric field of a portion of the horizontal output gate section 6 near the floating diffusion region 7 is modulated as it is strongly affected by the electric field of the channel stop region 5 because of the reduced width $W_1$ of the portion near the floating diffusion region 7, and the potential in that portion is lower than that in a portion of the horizontal output gate section 6 whose width $W_1$ is larger (see a solid-line curve 19 in the potential diagram of FIG. 8 of the accompanying drawings). As a result, the charge transfer efficiency of the horizontal output gate section 6 is relatively low.

Furthermore, since signal charges that have sufficiently been spread transversely across the horizontal charge transfer register 1 are collected into the horizontal output gate section 6, those signal charges which are positioned in transverse ends of the horizontal charge transfer register 1 have to travel a distance larger than those signal charges which are positioned in the center of the horizontal charge transfer register 1. The different distances to be traversed by the signal charges also adversely affect the charge transfer efficiency.

OBJECTS AND SUMMARY OF THE INVENTION

In view of the aforesaid drawbacks of the conventional horizontal charge transfer register, it is an object of the present invention to provide a horizontal charge transfer register which has an improved charge transfer efficiency at a horizontal output gate section.

According to the present invention, a charge transfer structure for transferring signal charges has a horizontal charge transfer register comprising an array of charge transfer sections for transferring signal charges in a charge transfer direction, the charge transfer sections including a final charge transfer section, a horizontal output gate section, and a floating diffusion region connected to the final charge transfer section through the horizontal output gate section. The charge transfer structure also has means, extending from the final charge transfer section to the horizontal output gate section, for orienting an electric field in the charge transfer direction in the horizontal output gate section.

The means comprises a pair of potential barrier regions spaced from each other by a distance which is progressively smaller from the final charge transfer section toward the horizontal output gate section, the potential barrier regions defining a charge transfer path therebetween which is substantially the same as or close to the width of the floating diffusion region.

Alternatively, the means comprises a potential well region extending from the final charge transfer section centrally through a charge transfer path in the horizontal output gate section to the floating diffusion region.

The potential barrier regions from the final charge transfer section to the horizontal output gate section collect small signal charges that have traveled on opposite sides of the horizontal charge transfer register into a central area beneath the final charge transfer section. The width of the charge transfer path in the horizontal output gate section is substantially the same as or close to the width of the floating diffusion region for preventing the electric field in the horizontal output gate section from being directed in a direction opposite to the charge transfer direction. With this arrangement, the horizontal output gate section has a relatively high charge transfer efficiency.

The alternative potential well region causes the electric field in the horizontal output gate section to be directed in the charge transfer direction, resulting in a relatively high charge transfer efficiency.

The above and other objects, features, and advantages of the present invention will become apparent from the following description of illustrative embodiments thereof to be read in conjunction with the accompanying drawings, in which like reference numerals represent the same or similar objects.

DETAILED DESCRIPTION OF THE PREFERRED EMBODIMENTS

Figure 3:
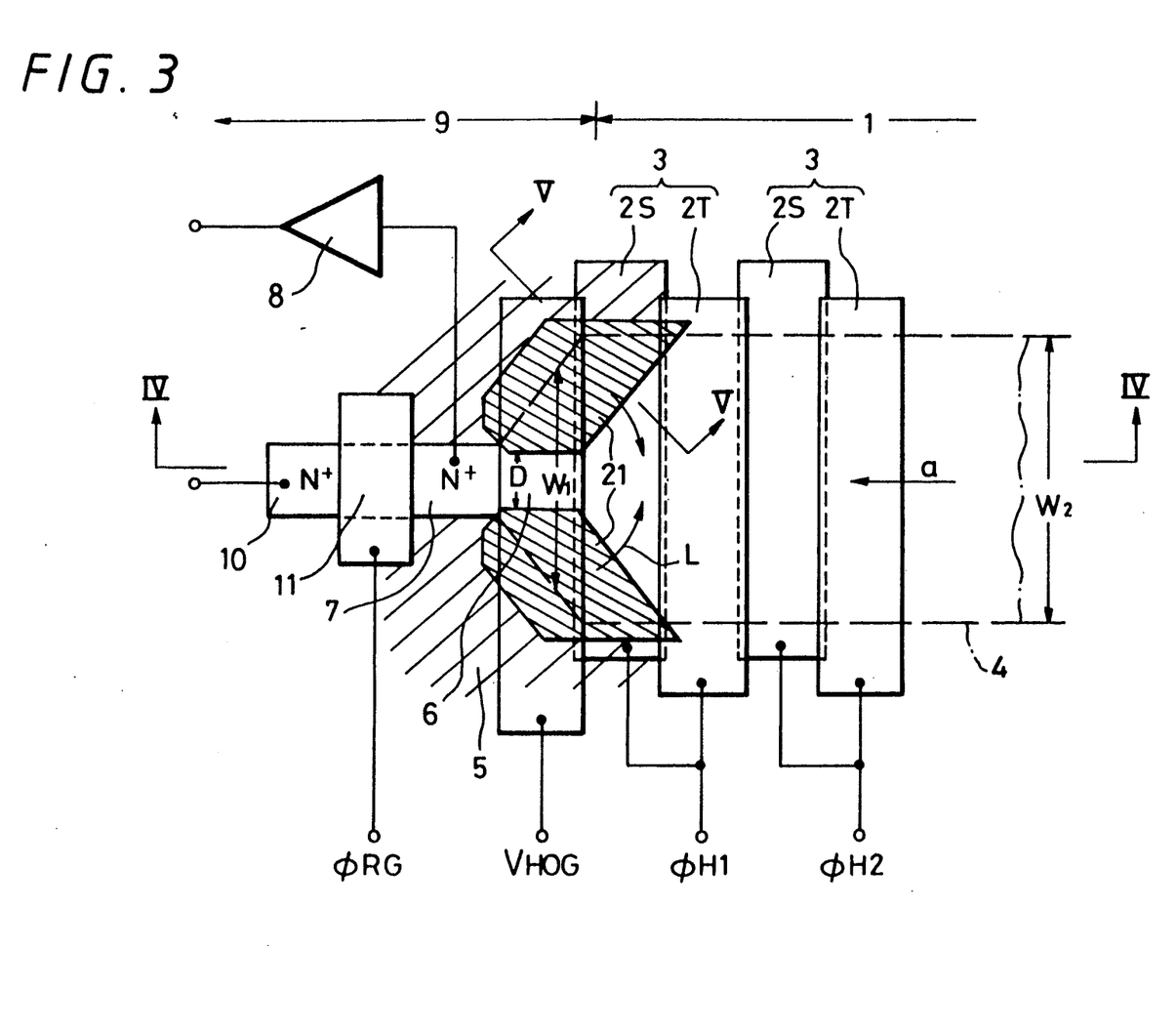
FIG. 3 is a fragmentary plan view of a structure of a horizontal charge transfer register according to an embodiment of the present invention.
Figure 4:
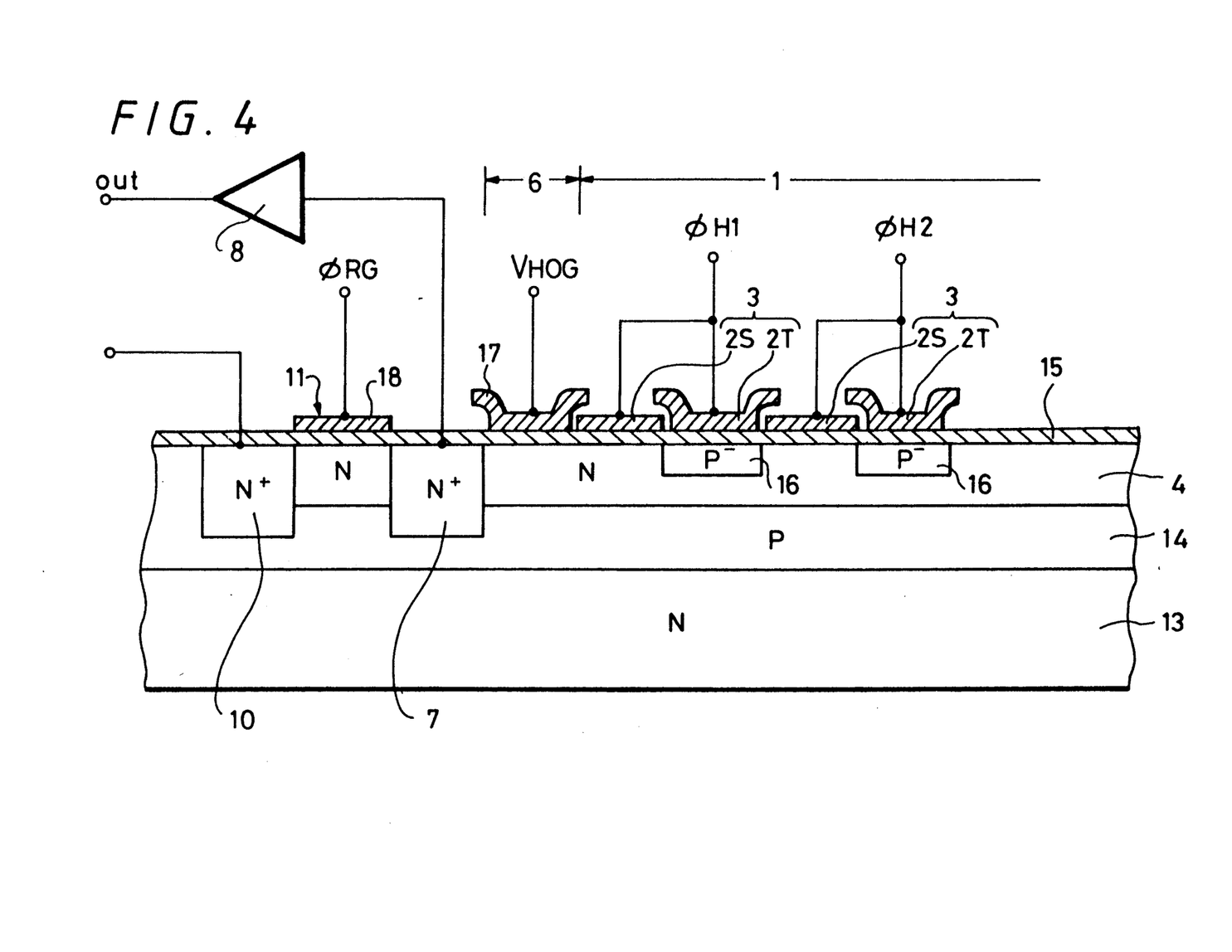
FIG. 4 is a cross-sectional view taken along line IV—IV of FIG. 3.
Figure 5:
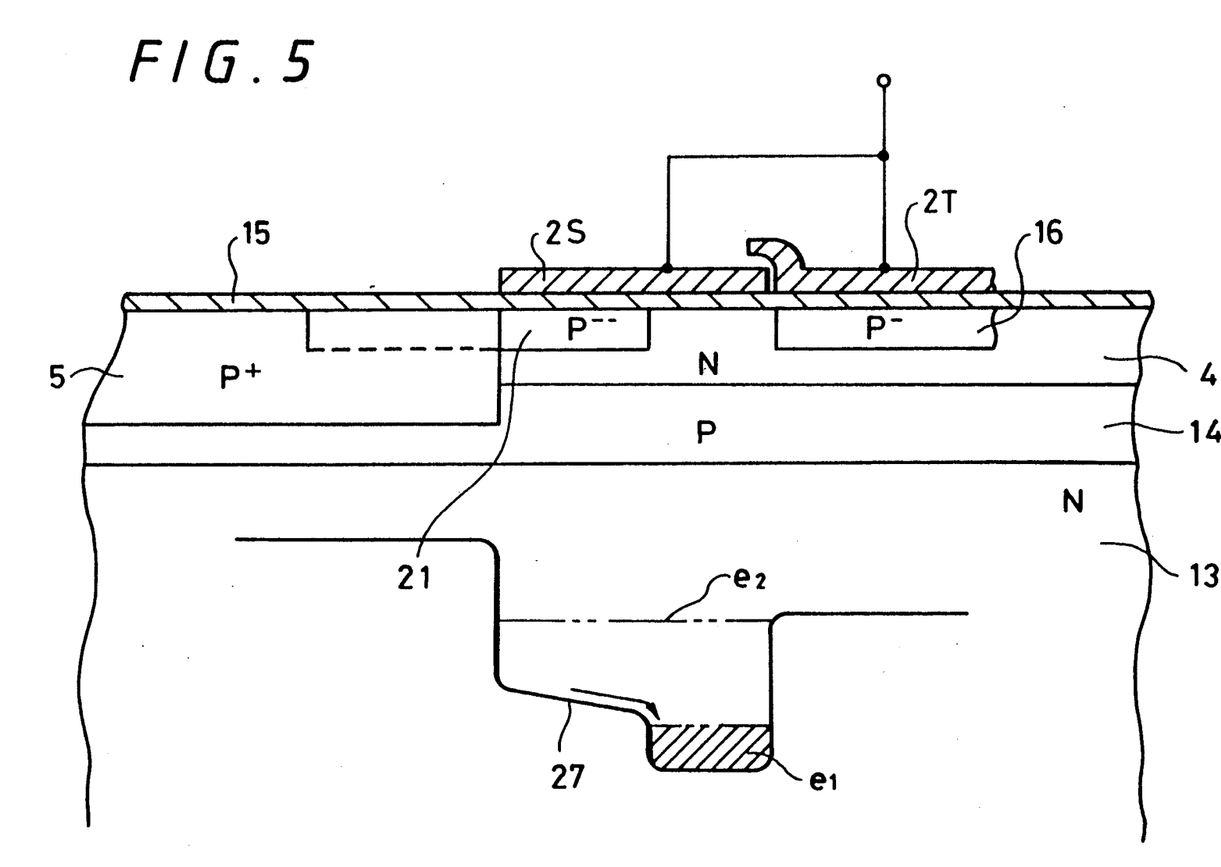
FIG. 5 is a cross-sectional view taken along line V—V of FIG. 3.

FIGS. 3 through 5 show a structure of a horizontal charge transfer register according to an embodiment of the present invention. The horizontal charge transfer register is designed for use in a CCD solid-state imaging device. Those parts of the horizontal charge transfer register which are identical to those of the conventional horizontal charge transfer register shown in FIGS. 1 and 2 are denoted by identical reference characters.

As shown in FIG. 3, the horizontal charge transfer register, generally denoted at 1, has an array of charge transfer sections 3 each having charge transfer electrodes, i.e., a charge storage electrode 2S and a charge transfer electrode 2T. The charge transfer sections 3 horizontally transfer signal charges in response to two-phase drive pulses $\phi H_1$, $\phi H_2$. The horizontal charge transfer register 1 also includes an embedded channel region 4 serving as a charge transfer path, and a channel stop region 5 (shown hatched) in an output section 9. The final charge transfer section 3 of the horizontal charge transfer register 1 is connected to a floating diffusion region 7 in the output section 9 through a horizontal output gate section 6. Signal charges transferred to the floating diffusion region 7 are discharged to a reset drain region 10 by a reset gate section 11. The final charge transfer section 3 is supplied with an independent drive pulse $\phi H$: that is larger in amplitude than those drive pulses $\phi H_1$, $\phi H_2$ which are applied to the charge transfer sections 3 that precede the final charge transfer section 3. A gate voltage $V_{HOG}$ is applied to the horizontal output gate section 6, and a gate voltage $\phi RG$ is applied to the reset gate section 11.

As shown in FIG. 4, a P-type well region 14 is formed on an N-type semiconductor substrate 13, and the embedded channel region 4, which is of the N type, is formed in the P-type well region 14. The charge storage and transfer electrodes 2S, 2T are alternately deposited on the N-type embedded channel region 4 with an insulative film 15 interposed therebetween. The charge storage and transfer electrodes 2S, 2T are connected in pairs, providing the array of charge transfer sections 3. P− layers 16 for developing a potential difference are disposed in the N-type embedded channel region 4 beneath the charge transfer electrodes 2T, respectively.

The horizontal output gate section 6 comprises a horizontal output gate electrode 17 deposited on the insulative film 15 on the embedded channel region 5. The gate voltage $V_{HOG}$ is applied to the horizontal output gate electrode 17. Both the floating diffusion region 7 and the reset drain region 10 are in the form of an N+ layer. The reset gate section 11 comprises a reset gate electrode 18 deposited on the insulative film 15 on the N-type region between the regions 7, 10. The embedded channel region 4 is tapered or constricted such that its width W2 is wider in the horizontal charge transfer register 1 and is progressively smaller in the horizontal output gate section 6 toward the floating diffusion region 7.

As shown in FIGS. 3 and 5, a pair of potential barrier regions 21 in the form of a P−− layer is formed, by ion implantation, in transversely spaced areas of the charge transfer path from the final charge transfer section 3 of the horizontal charge transfer register 1 to the horizontal output gate section 6. The potential barrier regions 21 are of a substantially V shape devoid of its center such that the distance therebetween is progressively smaller toward the horizontal output gate section 6 and minimum in the horizontal output gate region 6. In the horizontal output gate section 6, the effective charge transfer path that is defined between the potential barrier regions 21 has a uniform width D that is substantially the same as or close to the width of the floating diffusion region 7. The charge transfer path in the horizontal output gate section 6 may be increased in width at its end joined to the floating diffusion region 7.

When small signal charges are transferred, they are collected by the potential barrier regions 21 into a central area located beneath the final charge transfer section 3, particularly its charge storage region 2S, the central area being not influenced by the electric field of the channel stop region 5. Specifically, as shown in FIG. 3, an electric field L directed from the opposite sides toward the center of the charge transfer path is developed for collecting small signal charges e1 from the potential barrier regions 21 into the central area beneath the charge storage region 2S, as indicated by a potential distribution curve 27 in FIG. 5. The potential barrier regions 21 limit the width D of the charge transfer path in the horizontal output gate section 6 so that it is substantially the same as or close to the width of the floating diffusion region 7. The potential in the charge transfer path of such width is uniform in the charge transfer direction a as indicated by a broken-line curve 23 in FIG. 8, without being affected by the electric field from the channel stop region 5. In the horizontal output gate section 6, therefore, the electric field is prevented from being directed in the charge transfer direction a. Thus, the efficiency with which the signal charges are transferred, i.e., the charge transfer efficiency, is increased in the horizontal output gate section 6.

Figure 9:
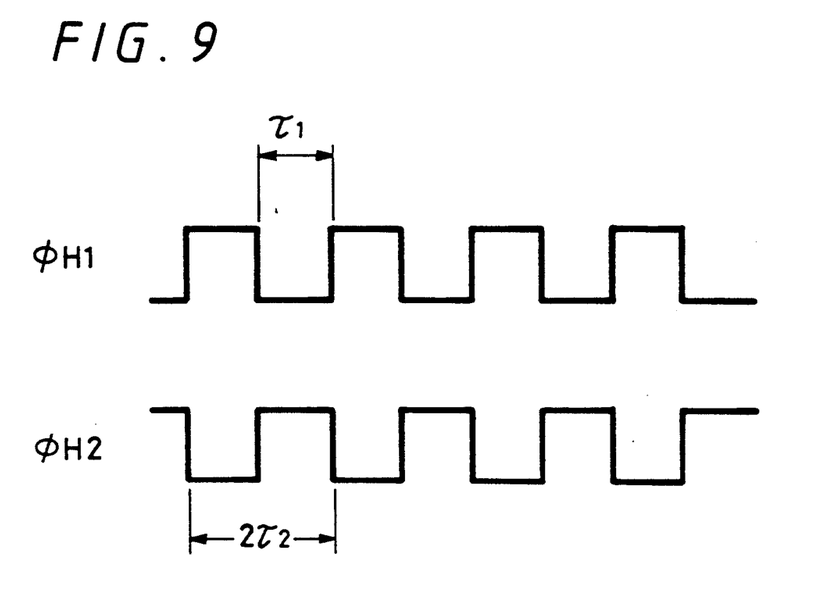
FIG. 9 is a diagram of drive pulses applied to the horizontal charge transfer register according to the present invention.

The signal charges which are being transferred from the final charge transfer section 3 of the horizontal charge transfer register 1 are constricted by the potential barrier regions 21. Therefore, the time in which the signal charges are constricted and transferred to the floating diffusion region 7 has a period of $2\tau_2$ (see FIG. 9) from the negative-going edge of a drive pulse $\phi H_2$ to the negative-going edge of a next drive pulse $\phi H_2$, rather than a period of $\tau 1$ from the negative-going edge of a drive pulse $\phi H_1$ to the positive-going edge of a next drive pulse $\phi H_1$ in the conventional arrangement shown in FIG. 1. This increased charge transfer time is also responsible for an increase in the charge transfer efficiency.

Large signal charges $e_2$ are transferred in the same manner as with the conventional charge transfer register shown in FIG. 1.

There has been proposed a technique (not shown) for forming a partial potential barrier layer along the charge transfer direction in the horizontal transfer register 1 to reduce the width of the charge transfer path when small signal charges are to be transferred, for attaining an increase in the charge transfer efficiency. With such a proposed arrangement, however, the number of signal charges that can be transferred by the horizontal charge transfer register is reduced. According to the above embodiment, the increased charge transfer efficiency in the horizontal output gate section 6 makes it possible to lower the voltage of the drive pulses $\phi H_1$ applied to the final charge transfer section 3 of the horizontal charge transfer register 1 without reducing the number of signal charges that can be transferred by the horizontal charge transfer register 1 (i.e., without having any potential barrier layer disposed in the horizontal transfer register). As a result, the electric power consumption by a drive circuit for the horizontal charge transfer register 1 is comparatively small.

Inasmuch as the charge transfer efficiency in the horizontal output gate section 6 is relatively high, the width of the floating diffusion region 7 may be relatively small. Consequently, the gain of the floating diffusion amplifier may be increased for high sensitivity.

Figure 6:
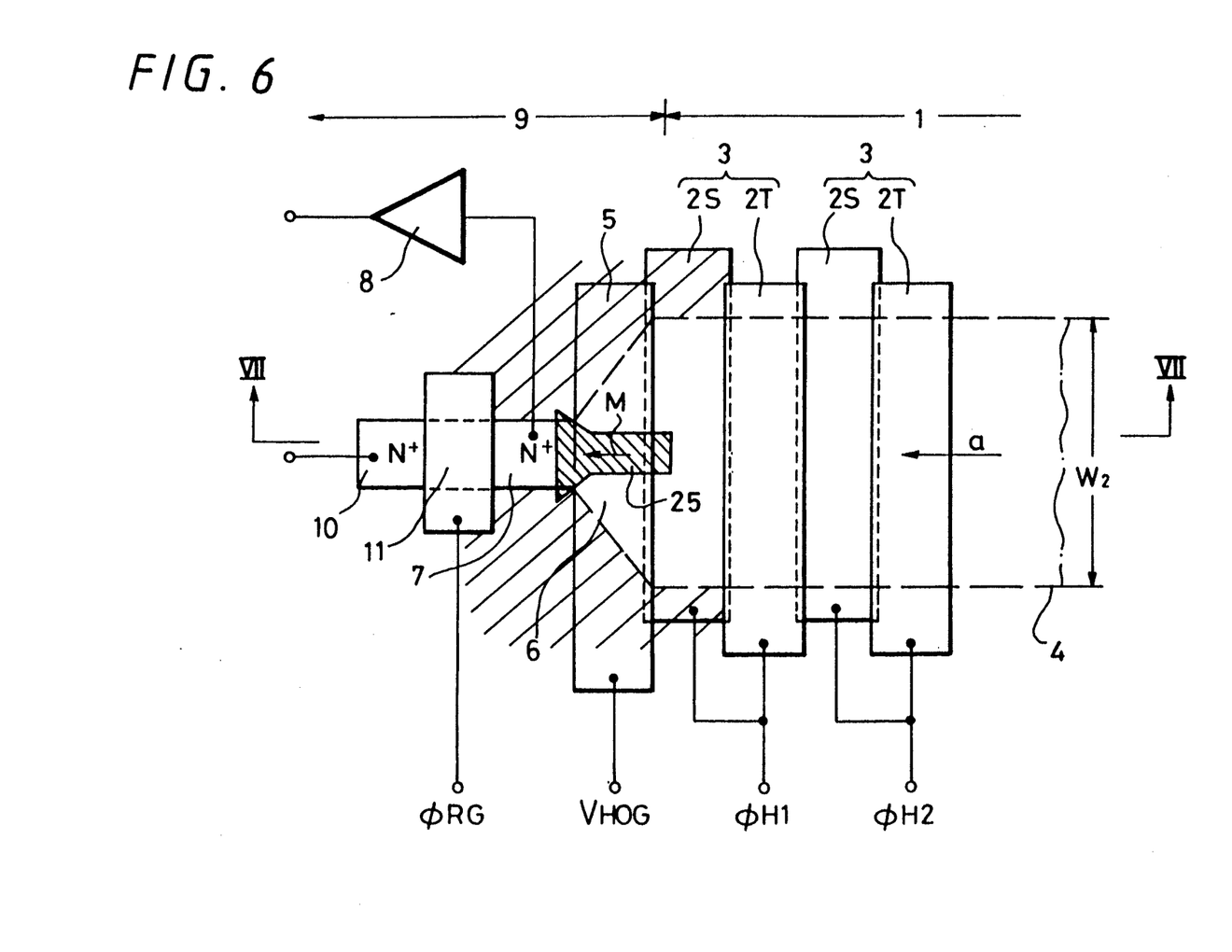
FIG. 6 is a fragmentary plan view of a structure of a horizontal charge transfer register according to another embodiment of the present invention.
Figure 7:
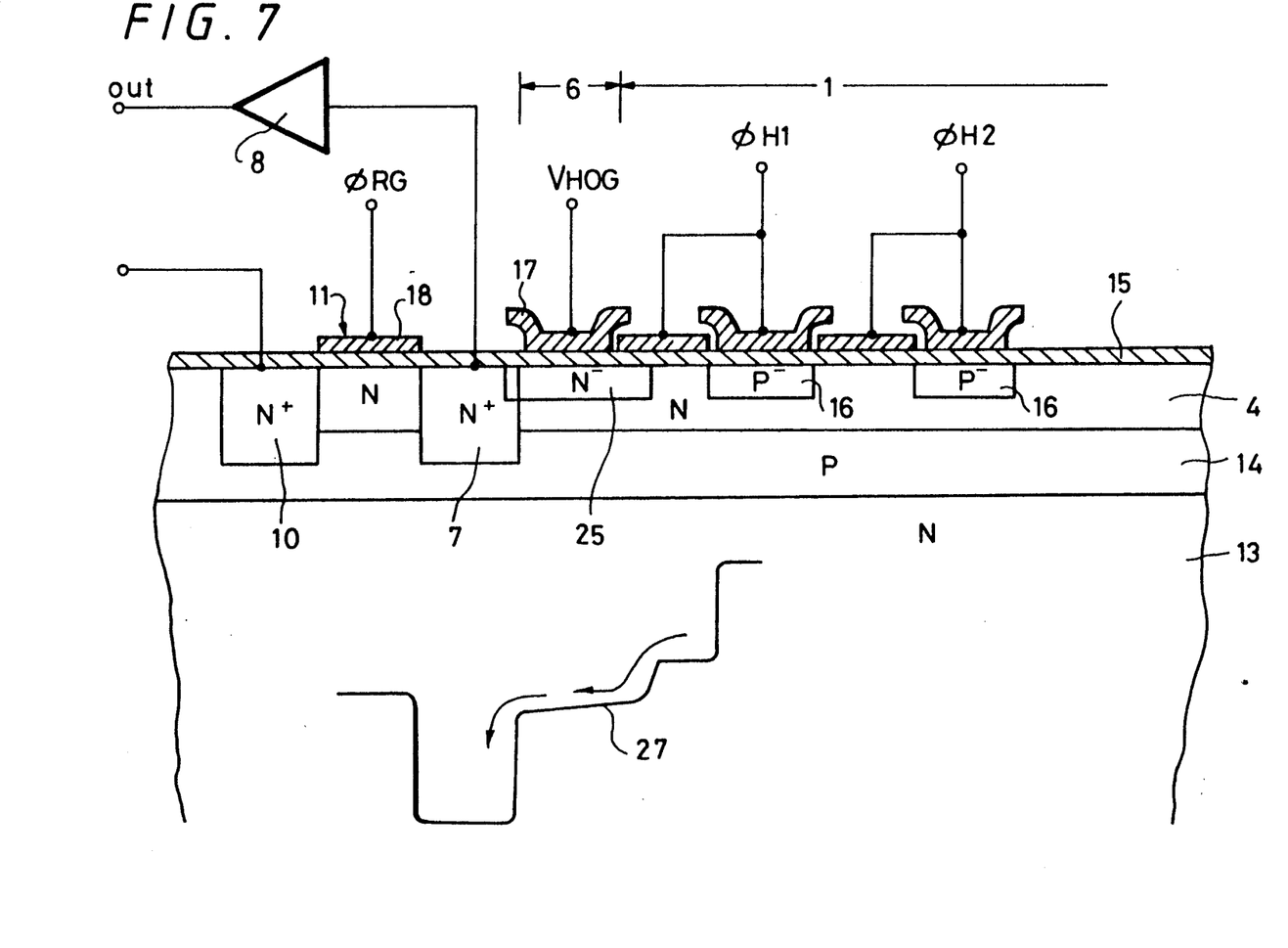
FIG. 7 is a cross-sectional view taken along line VII—VII of FIG. 6.

FIGS. 6 and 7 show a horizontal charge transfer register according to another embodiment of the present invention. The arrangement shown in FIGS. 6 and 7 differs from that shown in FIGS. 3 through 5 in that a potential well region 25 in the form of an $N^-$ layer is formed instead of the potential barrier regions 21, by ion implantation, in a central area of the charge transfer path from the final charge transfer section 3 of the horizontal transfer register 1 to the horizontal output gate section 6. As shown in FIG. 6, the potential well region 25 extends from the floating diffusion region 7 centrally across and through the horizontal output gate section 6 along the full length thereof to the area beneath the charge storage electrode 2S of the final charge transfer section 3. The potential well region 25 has a substantially uniform width, but may have a progressively larger width toward its end joined to the floating diffusion region 7. The other structural details shown in FIGS. 6 and 7 are identical to those shown in FIGS. 3 through 5, and will not be described in detail.

The potential well region 25 causes the electric field M in the horizontal output gate section 6 to be directed in the charge transfer direction a. Therefore, as small signal charges are transferred, they are transferred in and along the potential well region 25 as indicated by a potential distribution curve 27 in FIG. 7 and a potential 26 in FIG. 8. The charge transfer efficiency with which to transfer the signal charges to the floating diffusion region 7 is thus improved. With the wider end of the potential well region 25 joined to the floating diffusion region 7, the electric field M is directed better in the charge transfer direction for a greater increase in the charge transfer efficiency.

According to the embodiment shown in FIGS. 6 and 7, as with the previous embodiment shown in FIGS. 3 through 5, the increased charge transfer efficiency is effective to lower the voltage of the drive pulses $\phi H_1$ applied to the final charge transfer section 3 of the horizontal charge transfer register 1 without reducing the number of signal charges that can be transferred by the horizontal charge transfer register 1. A drive circuit for the horizontal charge transfer register 1 consumes a relatively small amount of electric energy. Furthermore, the width of the floating diffusion region 7 may be relatively small to increase the gain of the floating diffusion amplifier for high sensitivity.

The present invention is also applicable to a horizontal charge transfer register for use in a CCD solid-state imaging device such as a two-dimensional sensor, a liner sensor, or the like, or a horizontal charge transfer register such as a delay line or the like.

Having described preferred embodiments of the invention with reference to the accompanying drawings, it is to be understood that the invention is not limited to that precise embodiments and that various changes and modifications could be effected by one skilled in the art without departing from the spirit or scope of the invention as defined in the appended claims.

What is claimed is:

1. A horizontal charge transfer register for a charge transfer device which has a channel stop region in an output section, said register comprising:
   an array of charge transfer sections for transferring signal charges in a charge transfer direction, said charge transfer sections including a final charge transfer section, a horizontal output gate section and a floating diffusion region, said floating diffusion region being connected to said final charge transfer section through said horizontal output gate sections;
   a charge transfer channel provided beneath said array via which charges are transferred between said sections, said charge transfer channel being confined by said channel stop region, said charge transfer channel beneath said horizontal output gate section being progressively narrower in width from said final charge transfer section toward said floating diffusion region; and means for providing an electric field directed from the opposite sides of the charge transfer channel toward a center thereof at least in said final charge transfer section, to counteract an electric field opposite said charge transfer direction created between said channel stop regions and said final charge transfer section.

2. A horizontal charge transfer register according to claim 1, wherein said means comprises a pair of potential barrier regions spaced from each other by a distance which is progressively smaller from said final charge transfer section toward said horizontal output gate section, said potential barrier regions defining a further charge transfer channel in the horizontal output gate section which is substantially the same as or close to the width of said floating diffusion region.

3. A horizontal charge transfer register according to claim 2, wherein said means comprises a pair of potential barrier regions, each of said pair of potential barrier regions arranged in a direction perpendicular to said charge transfer direction.

4. A horizontal charge transfer register according to claim 1, wherein said means comprises a pair of potential barrier regions, each of said pair of potential barrier regions being arranged in a direction perpendicular to said charge transfer direction and defining a further charge transfer path in the horizontal output gate section which is substantially the same as or close to the width of said floating diffusion region.

5. A horizontal charge transfer register according to claim 4, wherein said pair of potential barrier regions are spaced from each other by a distance which is progressively smaller from said final charge transfer section toward said horizontal output gate section.

6. A horizontal charge transfer register according to claim 1, wherein said means comprises a potential well region extending from said final charge transfer section centrally through said charge transfer channel in said horizontal output gate section to said floating diffusion region.

* * * * *